US012096581B2

(12) United States Patent
Chen et al.

(10) Patent No.: US 12,096,581 B2
(45) Date of Patent: Sep. 17, 2024

(54) BOLSTER

(71) Applicant: AURAS TECHNOLOGY CO., LTD., New Taipei (TW)

(72) Inventors: Chien-Yu Chen, New Taipei (TW); Yi-Wun Chen, New Taipei (TW); Yun-Kuei Lin, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 261 days.

(21) Appl. No.: 17/537,692

(22) Filed: Nov. 30, 2021

(65) Prior Publication Data

US 2022/0174833 A1 Jun. 2, 2022

Related U.S. Application Data

(60) Provisional application No. 63/119,049, filed on Nov. 30, 2020.

(30) Foreign Application Priority Data

Jun. 16, 2021 (TW) ................................. 110121930

(51) Int. Cl.
*G06F 1/16* (2006.01)
*H05K 7/02* (2006.01)
*H05K 7/14* (2006.01)

(52) U.S. Cl.
CPC ................. *H05K 7/02* (2013.01); *G06F 1/16* (2013.01); *G06F 1/1632* (2013.01); *H05K 7/14* (2013.01); *H05K 7/1401* (2013.01); *F28F 2225/00* (2013.01)

(58) Field of Classification Search
None
See application file for complete search history.

(56) References Cited

U.S. PATENT DOCUMENTS 10,529,647 B2 * 1/2020 Jheng ..................... F16M 13/02
11,449,111 B2 * 9/2022 Buddrius ............ H01L 23/4006

* cited by examiner

*Primary Examiner* — Anthony Q Edwards
*Assistant Examiner* — Rashen E Morrison
(74) *Attorney, Agent, or Firm* — Amin, Turocy & Watson, LLP

(57) ABSTRACT

A bolster is provided and includes a bottom plate including a side plate extending upwards from a side of the bottom plate and a holding portion bending inwards from an edge of the side plate, a pillar vertically provided on the bottom plate and adjacent to the holding portion, and a torsion bar including two end portions and a main body portion, where one of the two end portions is fixed in the pillar and restricted by the holding portion, and the main body portion is restricted by the side plate. The bolster can effectively reduce warpage and deformation of the bottom plate.

10 Claims, 13 Drawing Sheets

BOLSTER

BACKGROUND

1. Technical Field

The present disclosure relates to bolsters, and more particularly, to a bolster that is applicable to a heat-dissipating device for a microprocessor.

2. Description of Related Art

A heat-dissipating device provided on a conventional microprocessor is often secured by threading a plurality of screws through both a bottom plate on which the microprocessor is installed and the heat-dissipating device. Typically, the screws are fastened on the bottom plate and the heat-dissipating device at four corners of the microprocessor. However, during fastening of the screws, forces are often concentrated at the four corners, resulting in warpage and deformation in the bottom plate and, in turn, poor electrical connections in the microprocessor.

Therefore, there is a need for a bolster that addresses the aforementioned shortcomings of the prior art.

SUMMARY

In order to address the aforementioned shortcomings of the prior art, the present disclosure provides a bolster, which comprises: a bottom plate including a side plate extending upwards from a side of the bottom plate and a holding portion bending inwards from an edge of the side plate; a pillar vertically provided on the bottom plate and adjacent to the holding portion; and a torsion bar including a main body portion and two end portions at two ends of the main body portion, wherein the main body portion is restricted by the side plate, and one of the two end portions is fixed in the pillar and restricted by the holding portion.

In the aforementioned bolster, the side plate is provided with a restricting opening, and the main body portion is provided with a bent restricting portion, wherein the bent restricting portion is inserted into the restricting opening and restricted by the restricting opening.

In the aforementioned bolster, the bottom plate is provided with a fastening hole adjacent to the side plate, such that the other one of the two end portions of the torsion bar is secured in the fastening hole.

In the aforementioned bolster, the bottom plate further includes another holding portion bending inwards from the edge of the side plate and provided separately from the holding portion to restrict the other one of the two end portions of the torsion bar.

In the aforementioned bolster, the restricting opening is arranged between the holding portion and the another holding portion.

In the aforementioned bolster, the present disclosure further comprises a fastener provided on the bottom plate and adjacent to the restricting opening, wherein the fastener abuts against the bent restricting portion and keeps the bent restricting portion inside the restricting opening.

In the aforementioned bolster, the bent restricting portion is free from protruding from the side plate.

In the aforementioned bolster, the present disclosure further comprises an opening arranged at a center of the bottom plate, wherein the bottom plate further includes a fastening piece extending upwards from an edge of the bottom plate adjacent to the opening and bending to extend to the side plate, and wherein the fastening piece is fixed in a recess hollowed inwards from the edge of the side plate, such that the torsion bar is restricted by the fastening piece.

In the aforementioned bolster, the present disclosure further comprises an opening arranged at a center of the bottom plate, wherein the bottom plate includes a fastening portion extending upwards from an edge of the bottom plate adjacent to the opening, such that the main body portion is restricted by both the fastening portion and the side plate.

In the aforementioned bolster, the main body portion includes a bent restricting portion, and wherein the bent restricting portion abuts against the fastening portion and the main body portion abuts against the side plate, such that the main body portion is restricted between the fastening portion and the side plate through the bent restricting portion.

In the aforementioned bolster, the other one of the two end portions of the torsion bar is fixed in a fastening hole of the fastening portion.

In the aforementioned bolster, the present disclosure further comprises an opening arranged at a center of the bottom plate, wherein the bottom plate includes a fastening portion extending upwards from an edge of the bottom plate adjacent to the opening, and wherein an edge of the fastening portion further includes a fastening piece extending towards the side plate and secured in a recess hollowed inwards from the edge of the side plate.

DETAILED DESCRIPTION OF THE EMBODIMENTS

Implementations of the present disclosure are described below with specific embodiments. Those skilled in the art can easily understand other advantages and technical effects of the present disclosure based on the content disclosed in this specification, and also implement or apply other equivalent implementations.

Figure 1A:
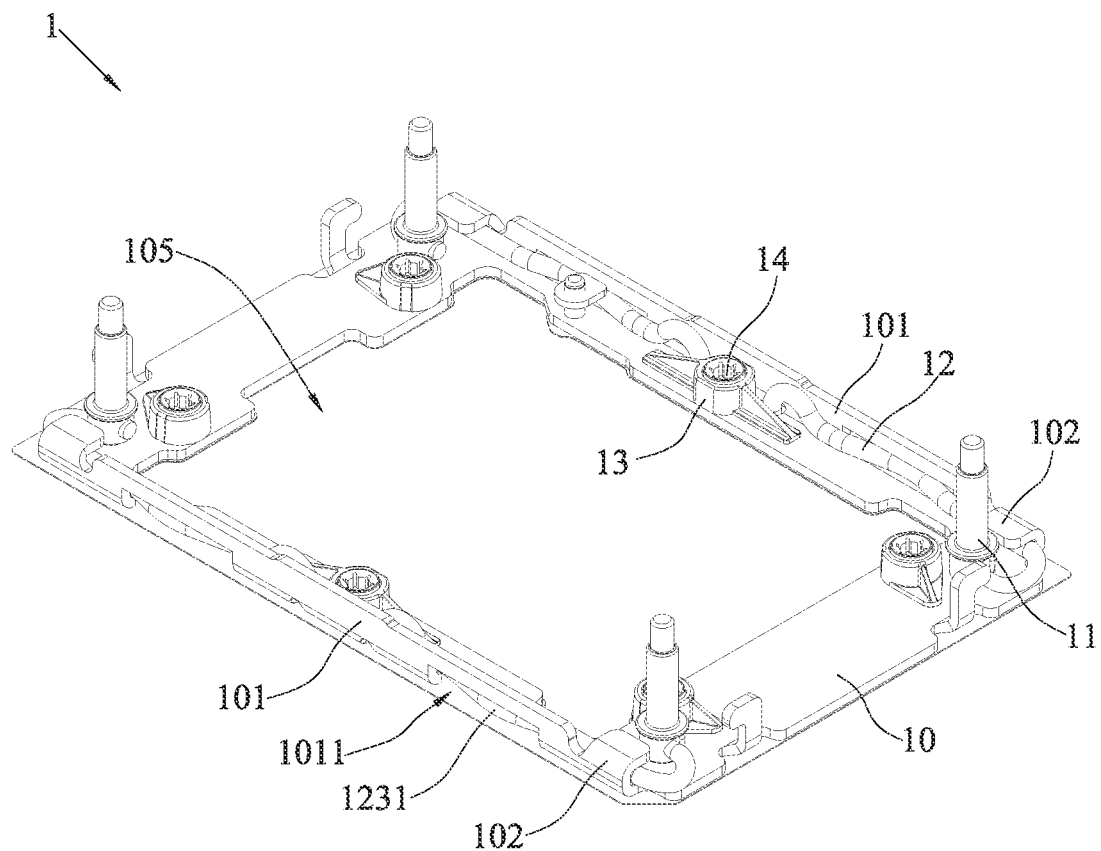
FIG. 1A is a perspective view of a bolster in accordance with a first embodiment of the present disclosure.
Figure 1B:
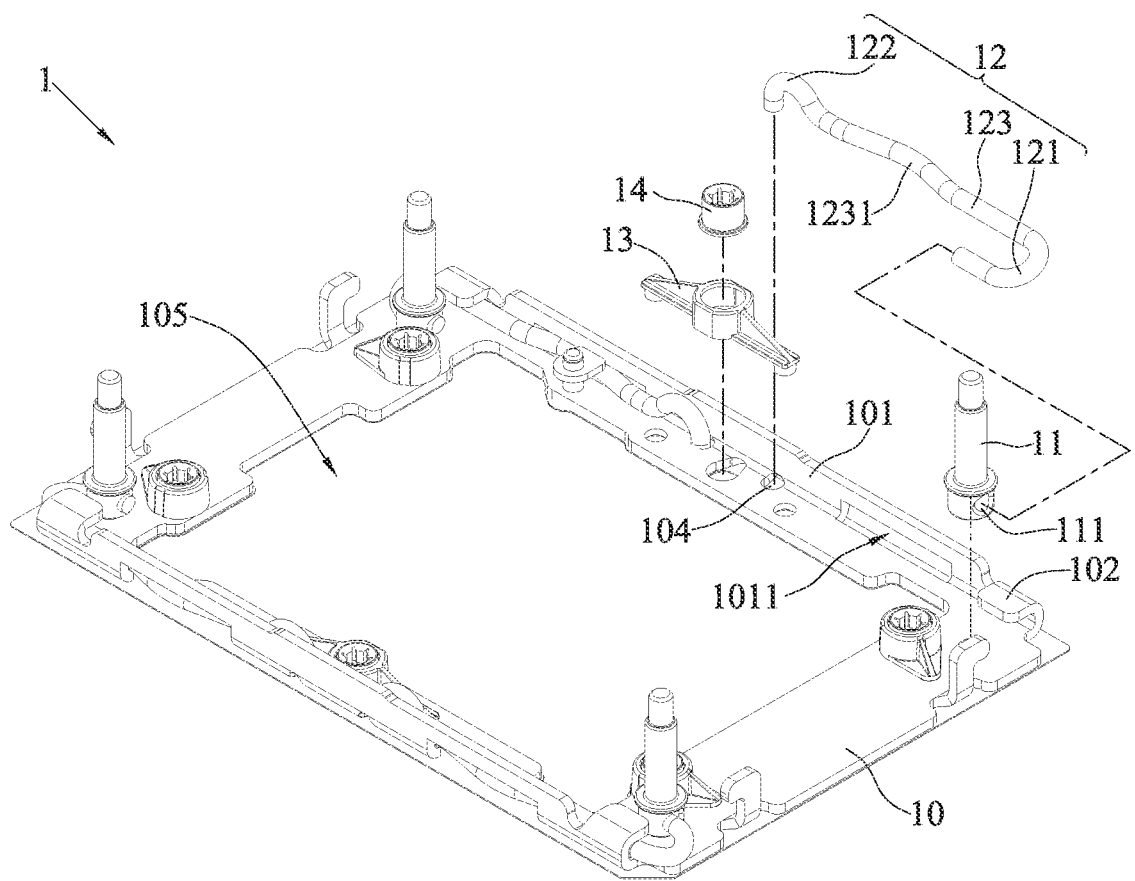
FIG. 1B is an exploded view of FIG. 1A.

Referring to both FIGS. 1A and 1B, a bolster 1 (e.g., a support structure) in accordance with a first embodiment of the present disclosure is shown. The bolster 1 includes a bottom plate 10, pillars 11, and torsion bars 12 (e.g., torsion members). Side plates 101 and holding portions 102 are provided on the bottom plate 10. The side plates 101 extend upwards (e.g., perpendicular to the bottom plate 10 and appear lengthwise) from sides (e.g., two sides) of the bottom plate 10, and each of the holding portions 102 bends inwards from an edge of a side plate 101 (e.g., near a corner of the bottom plate 10). The holding portions 102 are roughly in parallel with the bottom plate 10. In one embodiment, the bottom plate 10 is rectangular, and the bottom plate 10, the side plates 101 and the holding portions 102 can be formed integrally, for example, by stamping from a metal sheet, and can be secured on a circuit board (not shown). An opening 105 provided in the center of the bottom plate 10 can be used for receiving electronic components (not shown) on the circuit board, but the present disclosure is not limited as such.

The pillars 11 are disposed vertically on the bottom plate 10 and adjacent to the holding portions 102. The pillars 11 can be secured in holes (not shown) in the bottom plate 10 through bumps (not shown) at respective bottoms of the pillars 11. The pillars 11 are used for guiding downward installation of a heat-dissipating device. For example, the pillars 11 can be studs, and after the heat-dissipating device is installed on the pillars 11, nuts can be screwed on top of the pillars 11 in order to secure the heat-dissipating device. Moreover, a hole 111 is provided along the radial direction (along a direction in which the side plates are positioned) at the bottom of each pillar 11.

Each torsion bar 12 includes two end portions 121 and 122 and a main body portion 123. The end portion 121 can be secured in the hole 111 of a respective pillar 11, and the end portion 122 can be fastened onto the bottom plate 10. A mounting hole 104 is provided adjacent to a side plate 101 roughly in the middle of the whole bottom plate 10, and the end portion 122 can be bent in an "L" shape and fixed in the mounting hole 104. Furthermore, the main body portion 123 partially abuts against a respective side plate 101, and the main body portion 123 further extends outwards to form the end portion 121, which is snap-fitted to a respective holding portion 102. The end portion 121 further bends into a "U" shape and is passed through a respective hole 111. As the end portions 121 and 122 of a torsion bar 12 are secured in the hole 111 and the mounting hole 104, respectively, and the end potion 121 of the torsion bar 12 is snap-fitted to the holding portion 102 at the same time, the end portion 121 of the torsion bar 12 can be restricted by the holding portion 102 and the main body portion 123 of the torsion bar 12 can be restricted by the side plate 101.

In an embodiment, "the main body portion 123 of the torsion bar 12 can be restricted by the side plate 101" means that the main body portion 123 of the torsion bar 12 partially abuts against the side plate 101, such that the main body portion 123 is restricted by the side plate 101. In addition, the main body portion 123 can be provided with a bent restricting portion 1231, and the side plate 101 can be provided with a restricting opening 1011, so that the restricting portion 1231 of the main body portion 123 can be inserted into the restricting opening 1011 of the side plate 101 to be restricted by the restricting opening 1011. In an embodiment, the "bent restricting portion 1231" means that the overall shape of the main body portion 123 of the torsion bar 12 is non-linear to the extent that a portion of the main body portion 123 can be bent into a wave shape, an arc shape, a rectangular shape or the like to form the restricting portion 1231. The present disclosure does not limit the specific aspects of the restricting portion 1231.

In an embodiment, when the restricting portion 1231 is inserted into the restricting opening 1011 of the side plate 101, the restricting portion 1231 is free from being protruded from the side plate 101. For example, the restricting portion 1231 can be flush with the side plate 101 or slightly depressed than the side plate 101. However, the present disclosure is not limited as such.

In an embodiment, the end portions 121 and 122 and the restricting portions 1231 of the torsion bars 12 can be formed by bending straight metal bars, but the present disclosure is not limited to as such.

In an embodiment, four pillars 11 and four torsion bars 12 are located on the four corners of the bottom plate 10 (i.e., one pillar 11 corresponds to one torsion bar 12). Further, two side plates 101 are provided on opposite sides of the bottom plate 10. Each of the side plates 101 includes two holding portions 102 separately positioned to correspond to different torsion bars 12. Two torsion bars 12 on the same side (i.e., corresponding to the side plate 101) can be additionally secured by a fastener 13 disposed between the respective end portions 122. The fastener 13 can be attached onto the bottom plate 10 via a screw piece 14. As a result, the end portions 122 of the torsion bars 12 are limited by the fastener 13 to a certain extent. In an embodiment, the fastener 13 can be made of a plastic material, but the present disclosure is not limited to as such.

Once the pillars 11 and the torsion bars 12 are provided on the bottom plate 10, the end portions 121 of the torsion bars 12 will then be restricted by the respective holding portions 102, whereas the main body portions 123 and the restricting portions 1231 are restricted by the respective side plates 101 and the restricting openings 1011. As such, with the restricting portions 1231 of the torsion bars 12 being inserted into the restricting openings 1011 of the side plates 101, the torsion bars 12 of the bolster 1 in accordance with the present disclosure are free from requiring other restricting components, and the torsion bars 12 can be effectively limited by the side plates 101 and the holding portions 102. Moreover, when forces are applied uniformly on the torsion bars 12 during fastening of the screws, reaction forces exerted on the torsion bars 12 by the heat-dissipating device push the torsion bars 12 upwards. As a result, the end portions 121 of the torsion bars 12 become inclined, which increases the torques (e.g., the end portions 121 are pivoted on places where movements are restricted by the respective holding portions 102). This reduces the gravity of the heat-dissipating device and the forces exerted on the bottom plate 10 can become relatively uniform. Therefore, the present disclosure not only holds the heat-dissipating device firmly in place, but also effectively alleviates warpage and deformation of the bottom plate. Furthermore, the bolster 1 of the present disclosure is free from requiring other restricting components, thereby reducing design and manufacturing costs without compromising the overall strength.

Figure 2A:
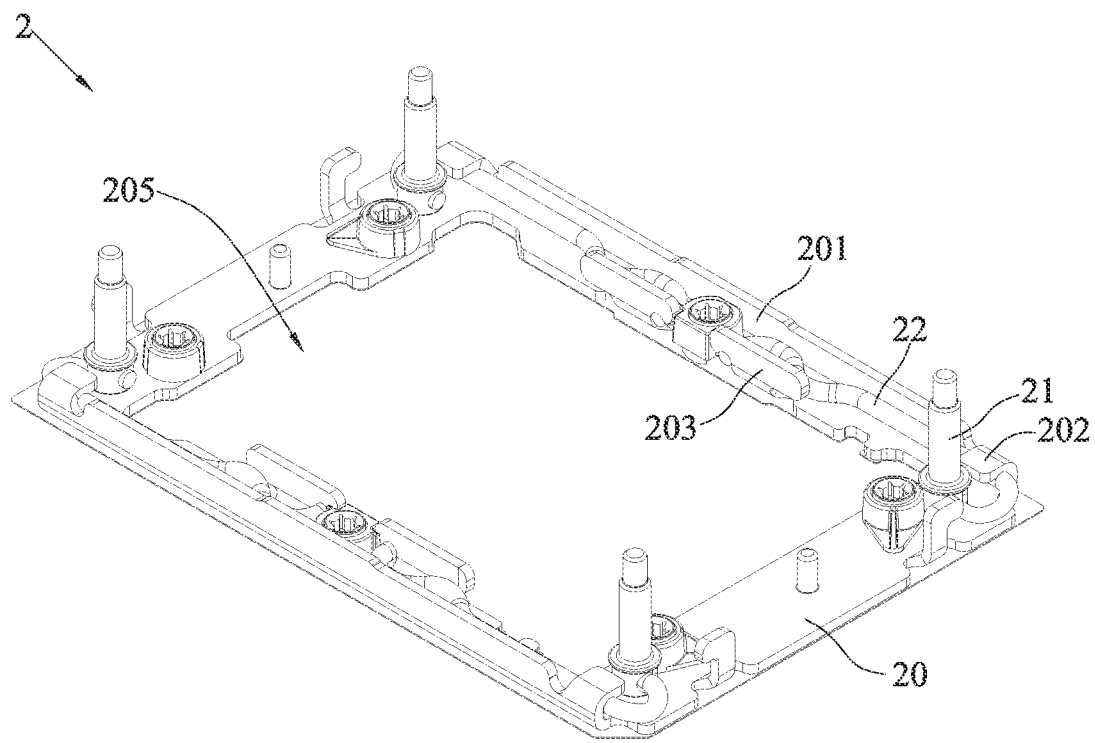
FIG. 2A is a perspective view of a bolster in accordance with a second embodiment of the present disclosure.
Figure 2B:
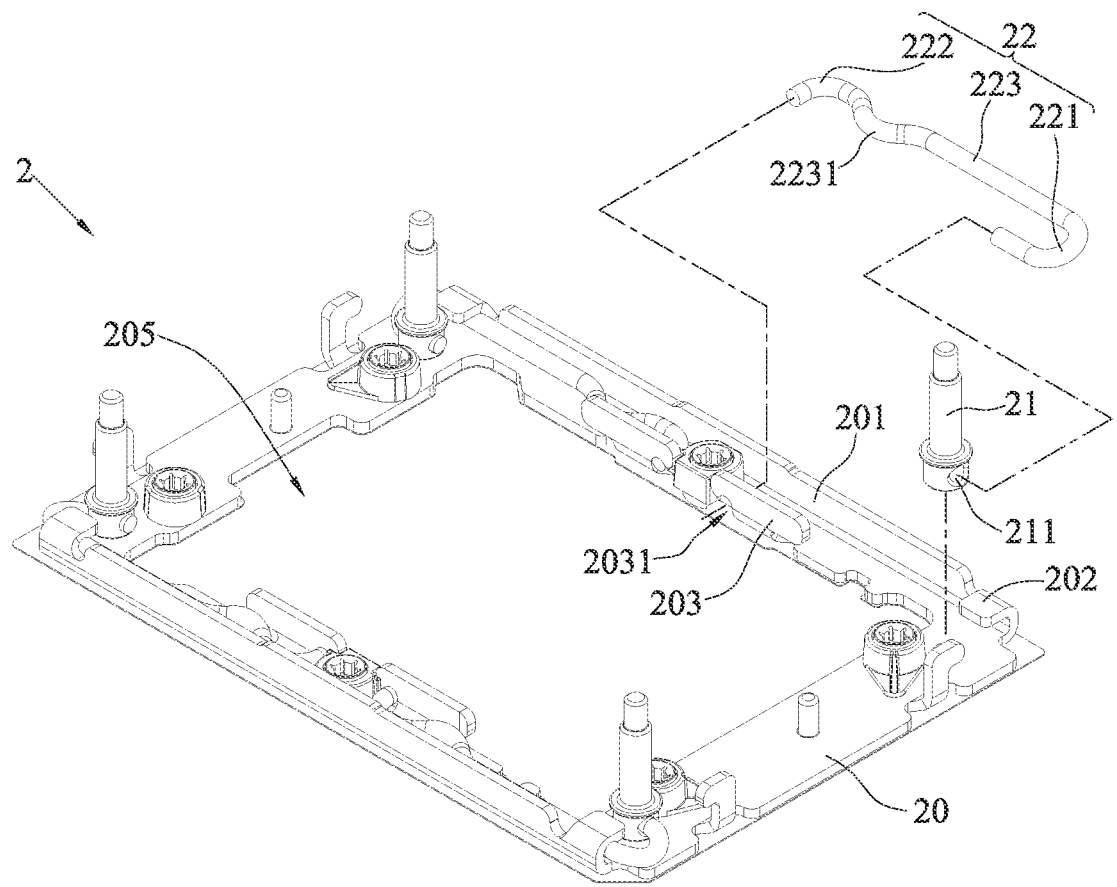
FIG. 2B is an exploded view of FIG. 2A.
Figure 2C:
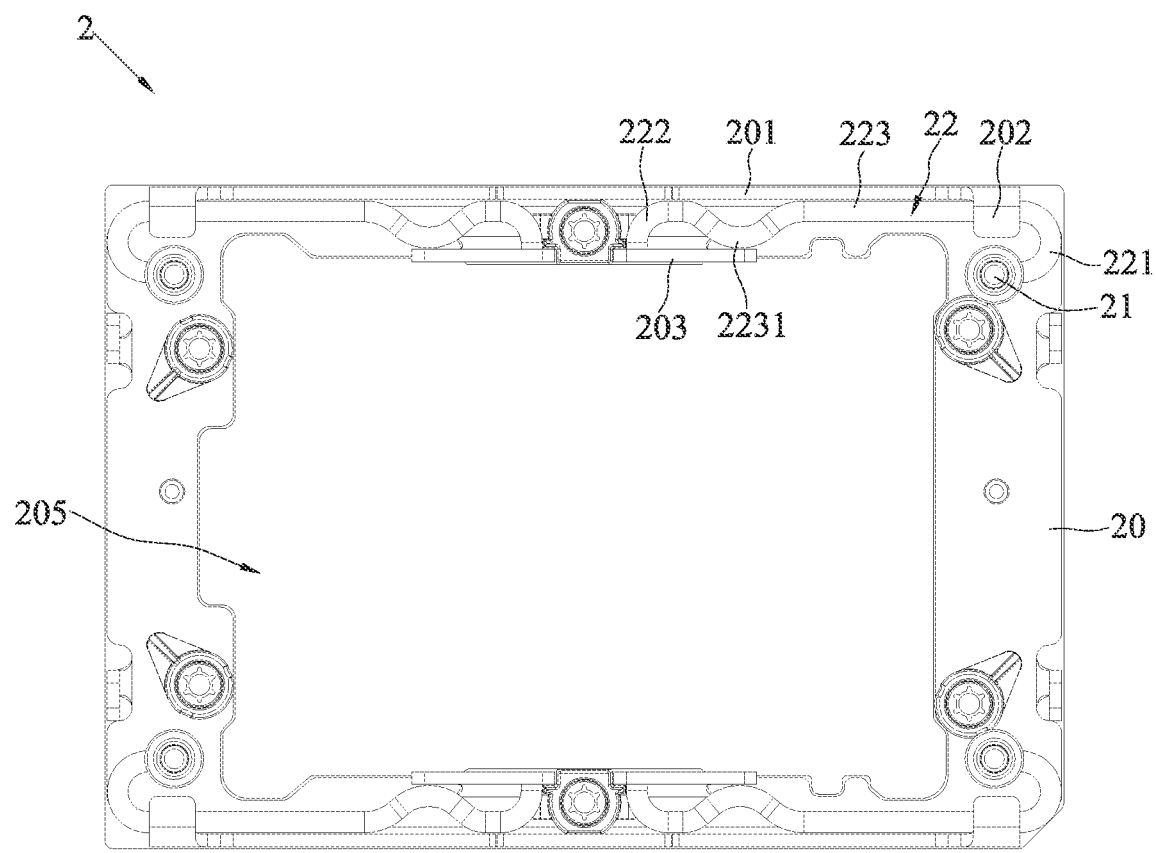
FIG. 2C is a top view of FIG. 2A.

Referring to FIGS. 2A, 2B and 2C, a bolster 2 in accordance with a second embodiment of the present disclosure is shown. The second embodiment differs from the first embodiment in the way the torsion bars 22 are restricted. The differences are described below, and technical details that are the same or similar to those described with respect to the first embodiment are omitted for brevity.

In an embodiment, fastening portions 203 extend upwards from edges of a bottom plate 20 adjacent to an opening 205. Each fastening portion 203 is provided with a fastening hole 2031. A fastening portion 203 and a side plate 201 can jointly restrict a torsion bar 22. A main body portion 223 of the torsion bar 22 can be formed with a bent restricting portion 2231. The "bent restricting portion 2231" herein refers to a portion of the main body portion 223 that is bent into a wave shape, an arc shape, a rectangular shape, or the like to form the restricting portion 2231 that abuts against the fastening portion 203, while the rest of main body portion 223 is linear and abuts against the side plate 201. As such, the overall main body portion 223 is limited between the fastening portion 203 and the side plate 201 through the restricting portion 2231. Meanwhile, an end portion 221 of the torsion bar 22 can be bent into a "U" shape and passes through a hole 211 of a pillar 21, whereas an end portion 222 of the torsion bar 22 can be bent into an "L" shape and secured in the fastening hole 2031 of the fastening portion 203.

In an embodiment, the height of the bend of the restricting portion 2231 can be slightly greater than the distance between the fastening portion 203 and the side plate 201. As such, when installing the torsion bar 22, a force can be applied to the torsion bar 22 to wedge the torsion bar 22 between the fastening portion 203 and the side plate 201. This allows the fastening portion 203 and the side plate 201 to further provide a clamping force to fasten the torsion bar 22 and limit any displacements of the torsion bar 22.

Figure 3A:
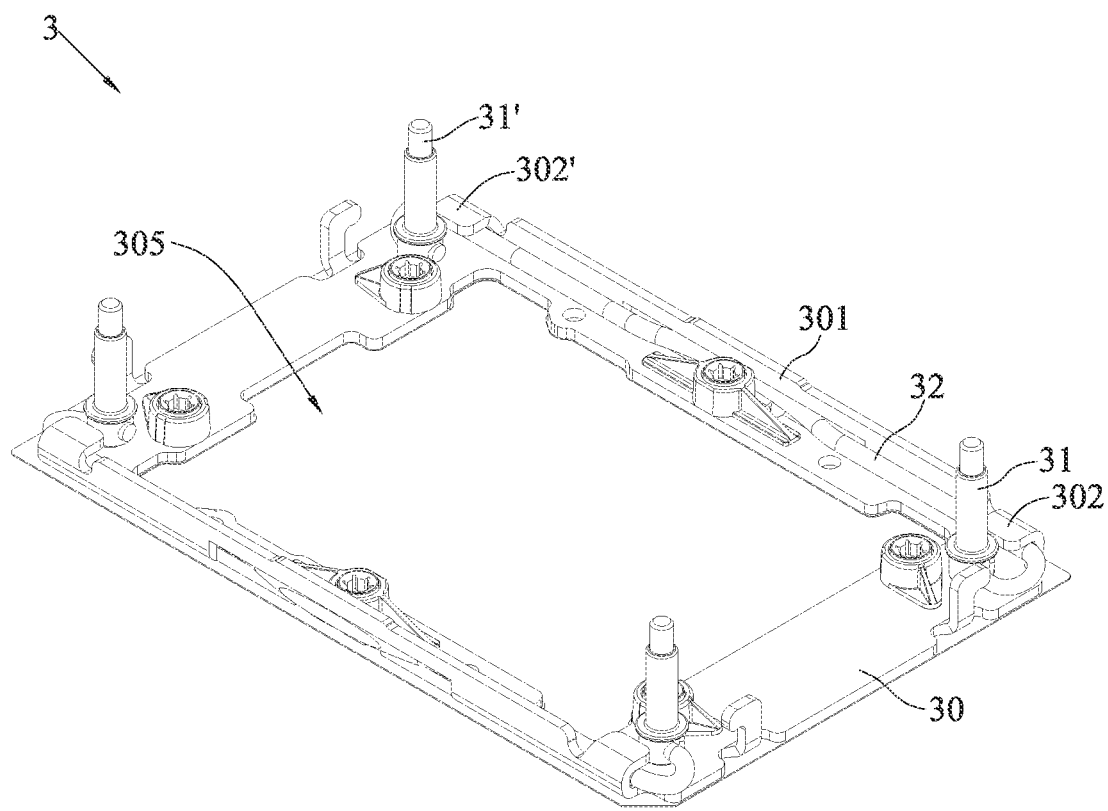
FIG. 3A is a perspective view of a bolster in accordance with a third embodiment of the present disclosure.
Figure 3B:
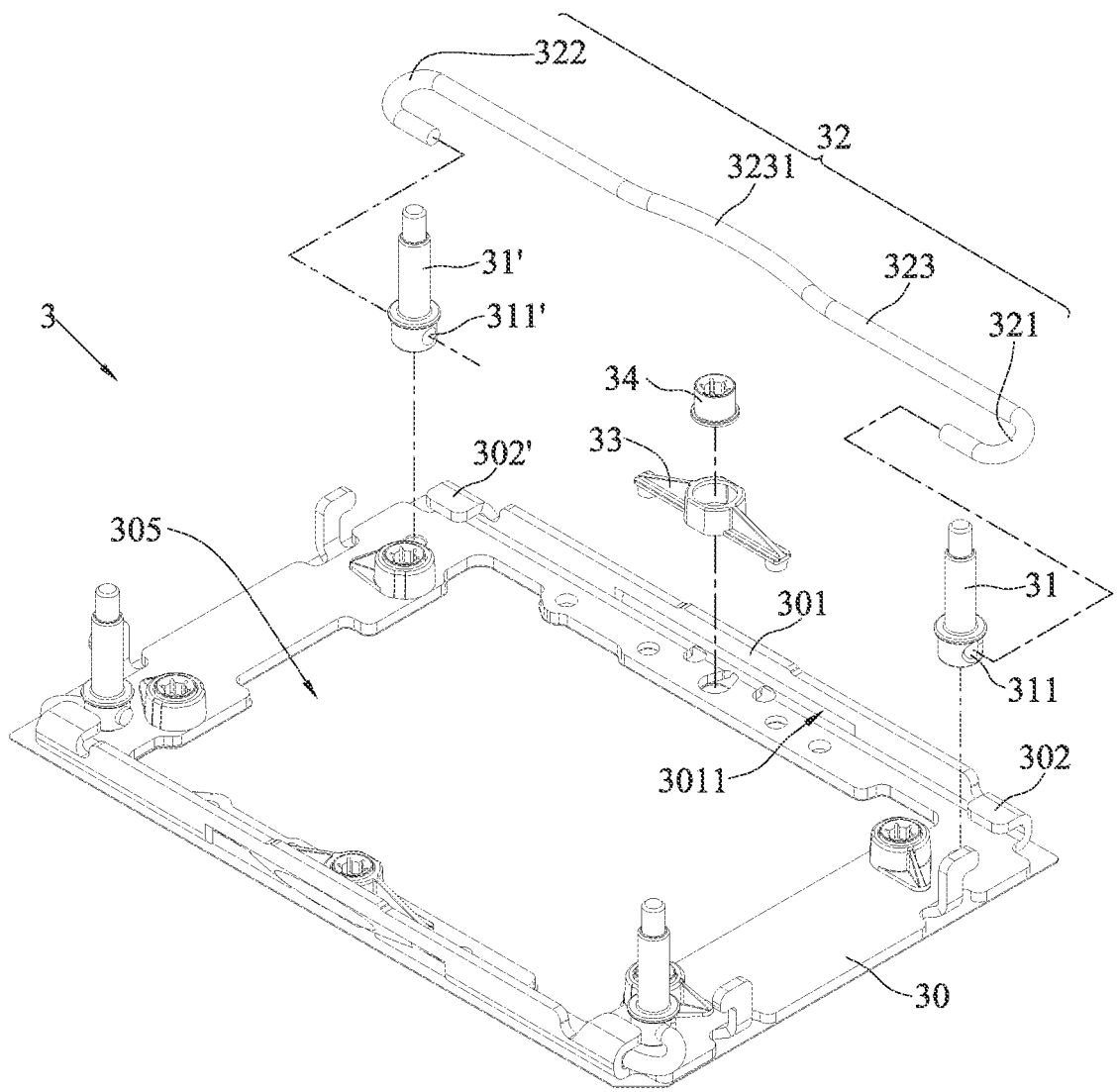
FIG. 3B is an exploded view of FIG. 3A.
Figure 3C:
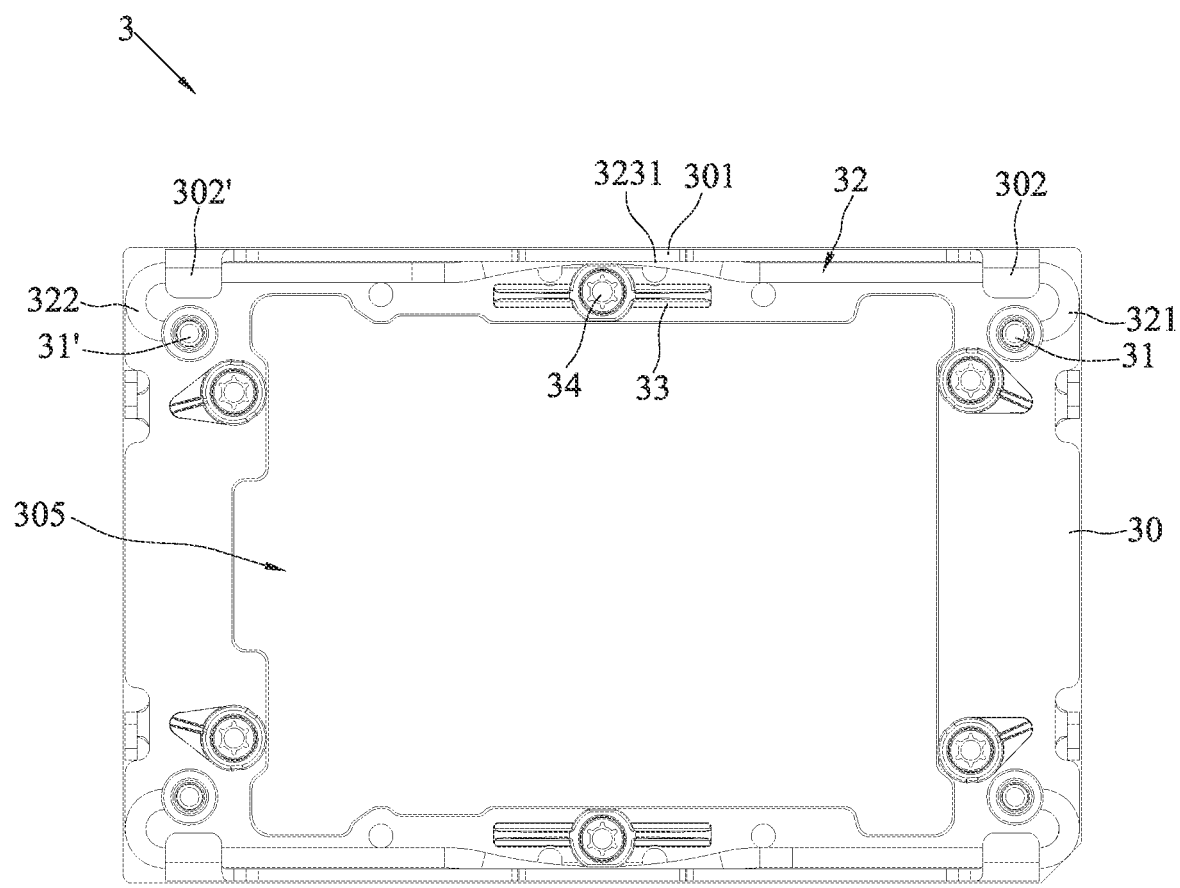
FIG. 3C is a top view of FIG. 3A.

Referring to FIGS. 3A to 3C, a bolster 3 in accordance with a third embodiment of the present disclosure is shown. The third embodiment differs from the previous embodiment in the way torsion bars 32 are restricted and the number of torsion bars 32. The differences are described below, and technical details that are the same or similar to those described with respect to the previous embodiment are omitted for brevity.

In an embodiment, each side plate 301 includes two holding portions 302 and 302' that are separately disposed for limiting a single torsion bar 32. An end portion 321 of the torsion bar 32 is snap-fitted into and restricted by the holding portion 302, and is further bent into a "U" shape to be passed through a hole 311 of a pillar 31. On the other hand, an end portion 322 of the torsion bar 32 is snap-fitted into and restricted by the holding portion 302', and is further bent into a "U" shape to be passed through a hole 311' of another pillar 31'. The side plate 301 is provided with a restricting opening 3011 located between the holding portions 302 and 302', and a part of a main body portion 323 of the torsion bar 32 can be bent into a wave shape, an arc shape, a rectangular shape, etc., to form a restriction portion 3231. The restricting portion 3231 can be inserted into the restricting opening 3011 of the side plate 301 to be restricted by the restricting opening 3011.

In an embodiment, a fastener 33 can be provided on the bottom plate 30 in proximity to the restricting opening 3011. The fastener 33 abuts against the restricting portion 3231 and keeps the restricting portion 3231 inside the restricting opening 3011. A screw piece 34 is used to arrange the fastener 33 on the bottom plate 30, so that the torsion bar 32 can be restricted by the fastener 33 to some extent.

Figure 4A:
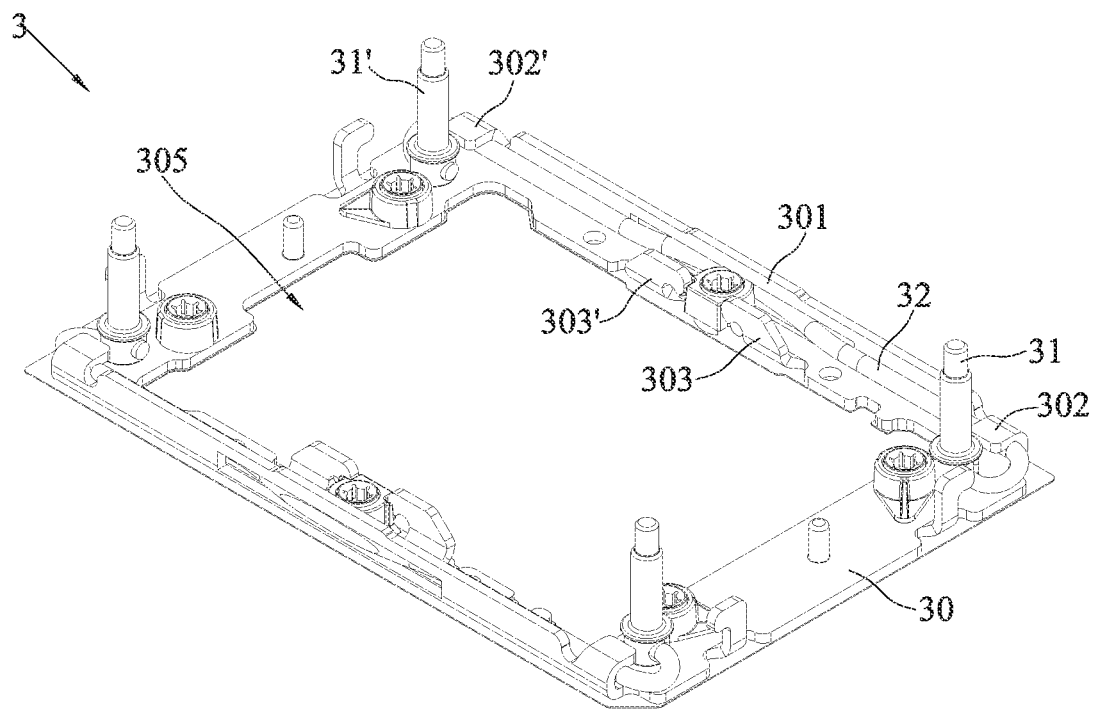
FIG. 4A is a perspective view of a bolster in accordance with a fourth embodiment of the present disclosure.
Figure 4B:
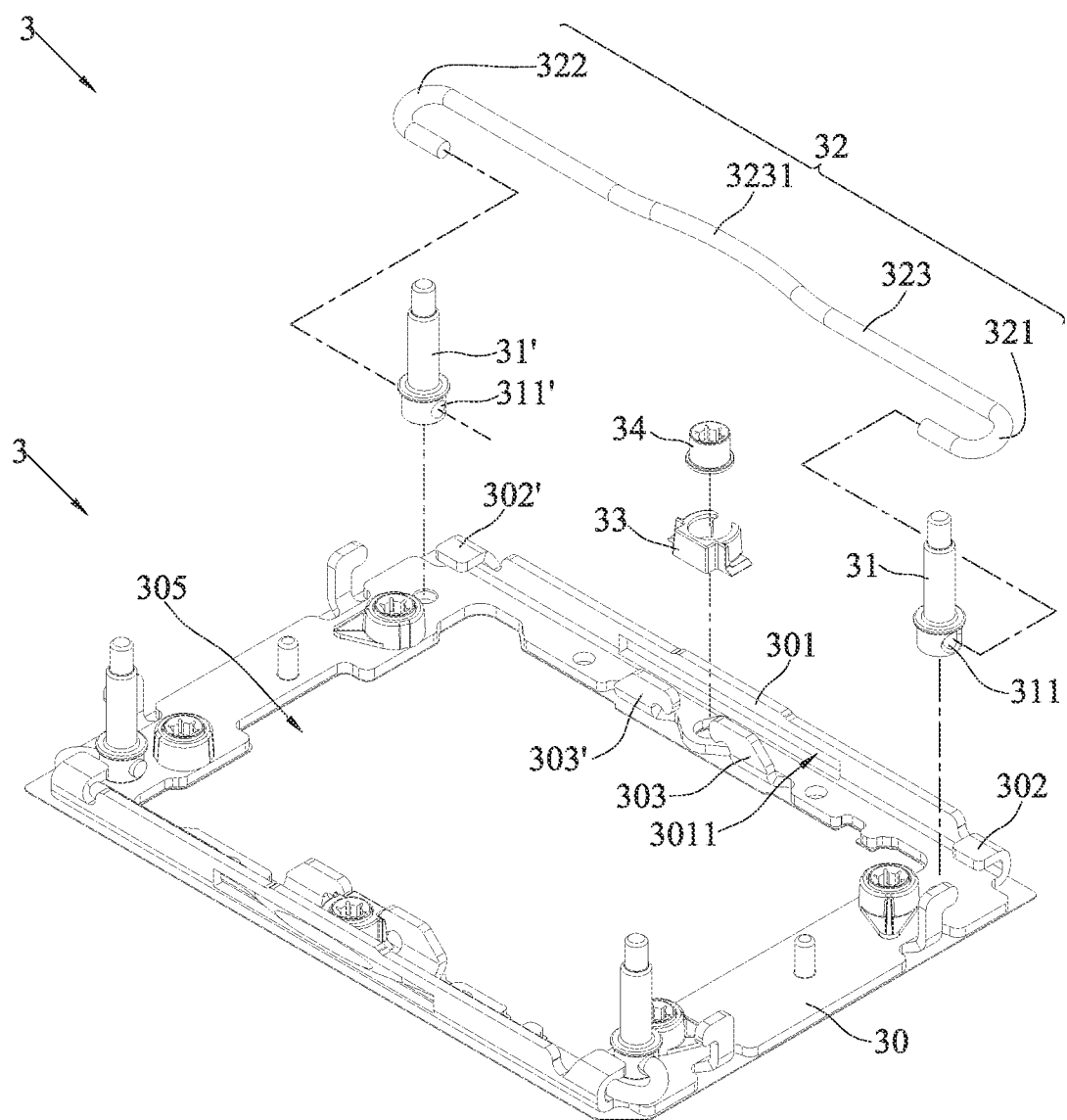
FIG. 4B is an exploded view of FIG. 4A.
Figure 4C:
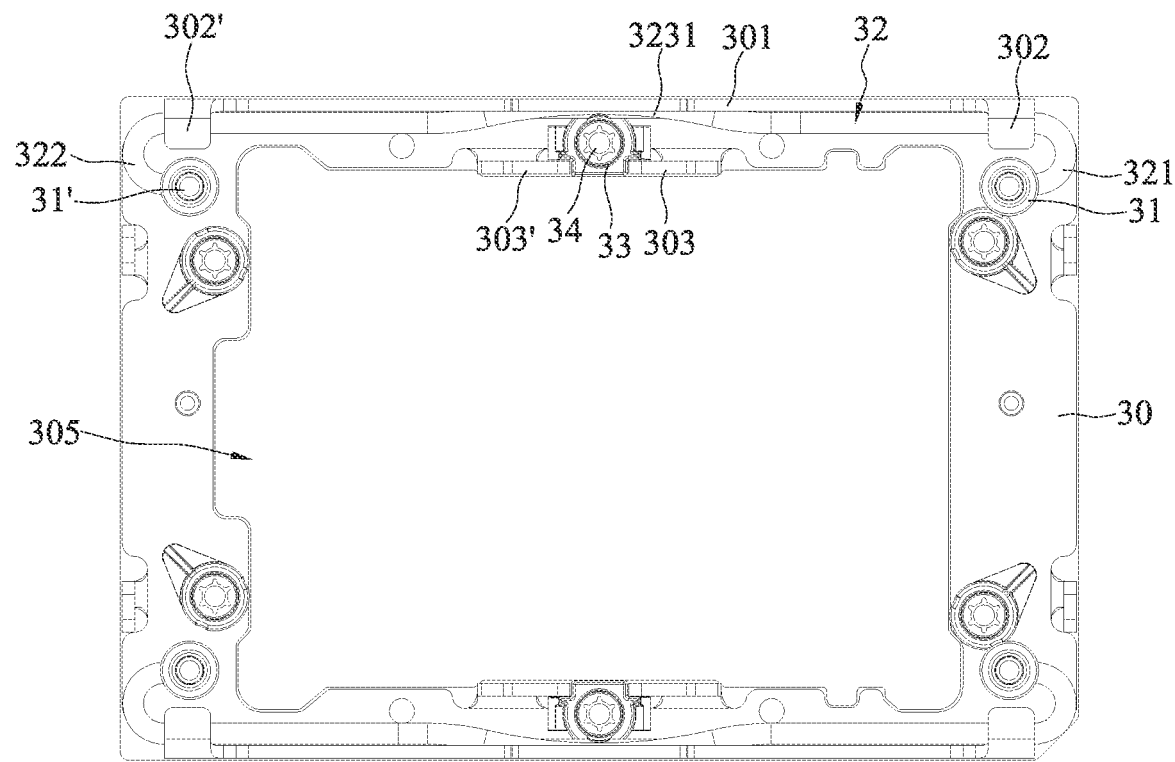
FIG. 4C is a top view of FIG. 4A.

Referring to FIGS. 4A to 4C, a bolster 3 in accordance with a fourth embodiment of the present disclosure is shown. The fourth embodiment differs from the third embodiment in the aspects of the fastener 33 and fastening portions 303 and 303'. The differences are described below, and details that are the same or similar to those described with respect to the previous embodiment are omitted for brevity.

In an embodiment, a plurality of fastening portions 303 and 303' extending upwards from edges of the bottom plate 30 adjacent to the opening 305 are provided. A fastener 33 can be provided between the fastening portions 303 and 303', so that the fastener 33 is restricted by the fastening portions 303 and 303'. The fastener 33 can be similarly used to abut against the restricting portion 3231 and keep the restricting portion 3231 inside the restriction opening 3011. The screw piece 34 is used to arrange the fastener 33 on the bottom plate 30, so that the torsion bar 32 can also be limited by the fastener 33 and the fastening portions 303 and 303' to a certain extent.

Figure 5:
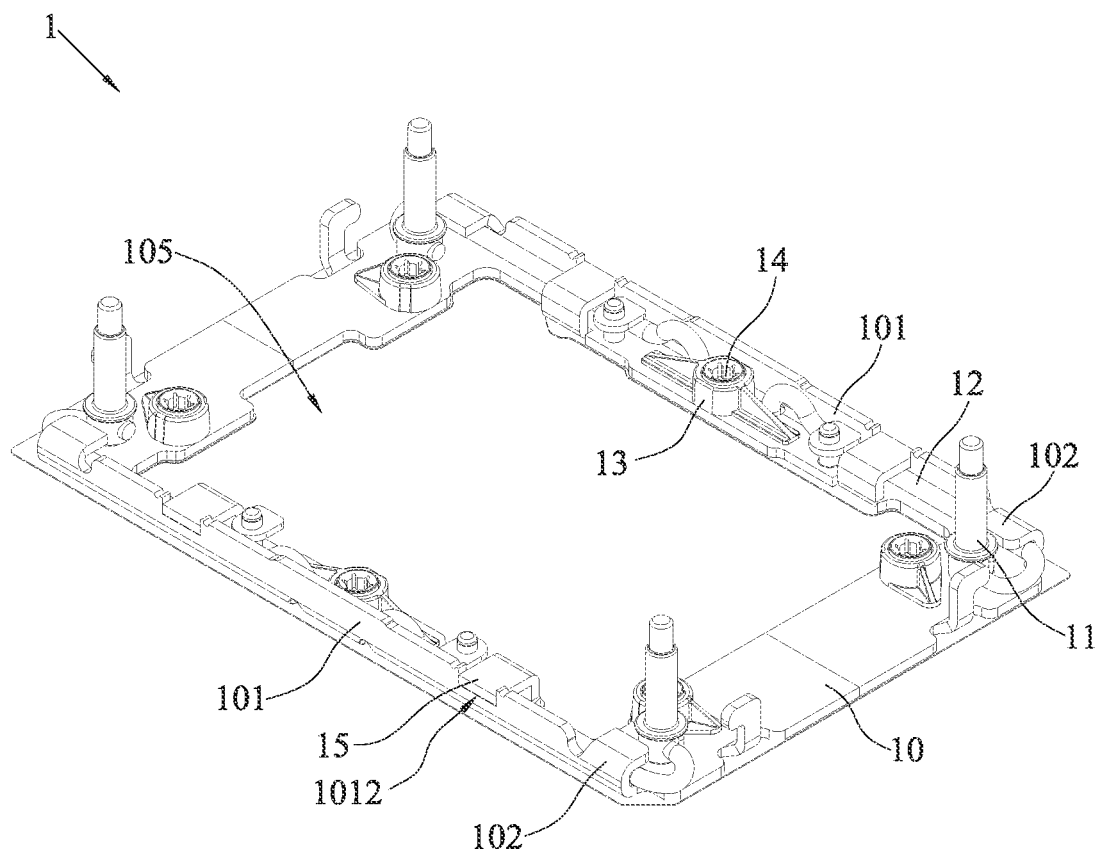
FIG. 5 is a perspective view of a bolster in accordance with a fifth embodiment of the present disclosure.

Referring to FIG. 5, a bolster 1 in accordance with a fifth embodiment of the present disclosure is shown. The fifth embodiment differs from the first embodiment in the way the torsion bars 12 are restricted. The differences are described below, and details that are the same or similar to those described with respect to the first embodiment are omitted for brevity.

In an embodiment, fastening pieces 15 are provided that extend upwards from edges of the bottom plate 10 adjacent to the opening 105 and bent to extend to respective side plates 101. The side plates 101 include recesses 1012 hollowed inwards from the edges of the side plates 101, and the fastening pieces 15 can be secured in the recesses 1012, so that the torsion bars 12 are restricted by the fastening pieces 15. In an embodiment, the fastening pieces 15 can be formed by stamping at the same time as the bottom plate 10, and the fastening pieces 15 can be riveted into the recesses 1012 of the side plates 101 by a riveting process in order to increase the strength of the bottom plate 10 while providing support.

In an embodiment, the restricting openings 1011 in the side plates 101 in the first embodiment are omitted; the restricting portions 1231 of the torsion bars 12 in the first embodiment are omitted; and the main body portions 123 of the torsion bars 12 extend towards and connect with the respective end portions 122. The side plates 101 and the torsion bars 12 of this embodiment can also be arranged in the same way as those in the first embodiment. However, the present disclosure is not limited as such.

Figure 6:
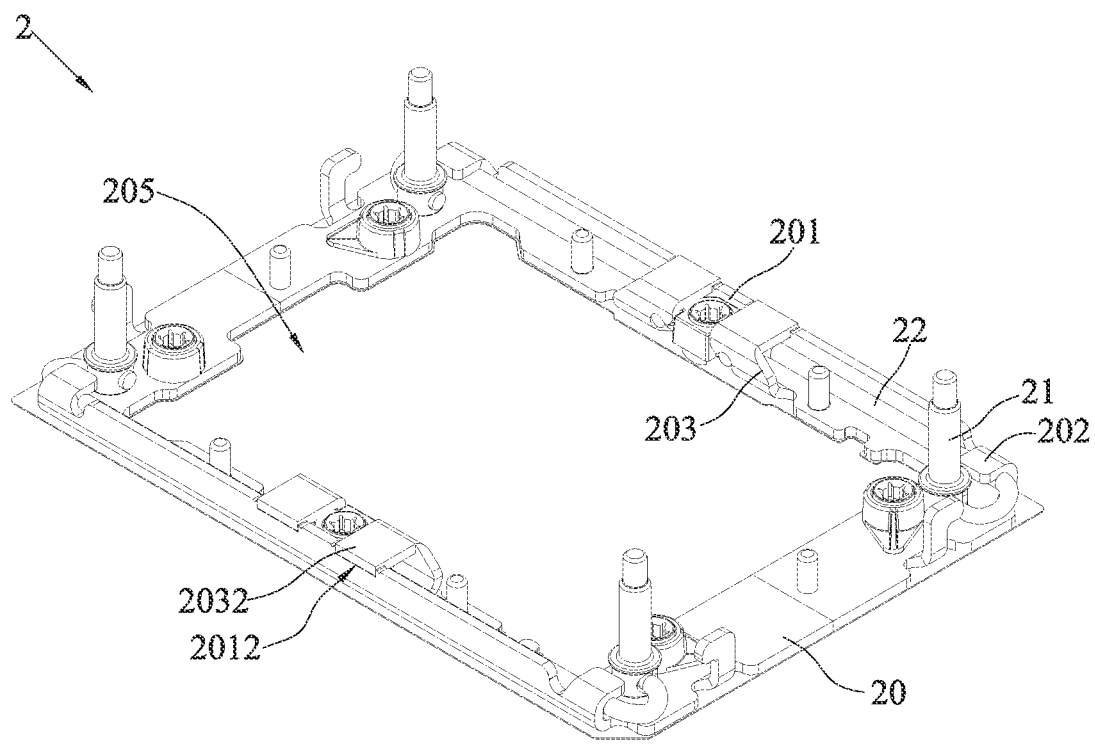
FIG. 6 is a perspective view of a bolster in accordance with a sixth embodiment of the present disclosure.

Referring to FIG. 6, a bolster 2 in accordance with a sixth embodiment of the present disclosure is shown. The sixth embodiment differs from the second embodiment in the aspects of the fastening portions 203. The differences are described below, and details that are the same or similar to those described with respect to the second embodiment are omitted for brevity.

In an embodiment, fastening portions 203 extend from edges of the bottom plate 20 adjacent the opening 205, and fastening pieces 2032 extend from edges of the respective fastening portions 203 towards respective side plates 201. The side plates 201 include recesses 2012 hollowed inwards from the edges of the side plates 201, and the fastening pieces 2032 are secured inside the respective recesses 2012, so that the torsion bars 22 are restricted by the fastening pieces 2032. In an embodiment, the fastening pieces 2032 can be formed by stamping at the same time as the bottom plate 20 and the fastening portions 203, and the fastening pieces 2032 can be riveted into the recesses 2012 of the side plates 201 by a riveting process in order to increase the strength of the bottom plate 20 while providing support.

In an embodiment, the restricting portions 2231 of the torsion bars 22 in the second embodiment are omitted, and the main body portions 223 of the torsion bars 22 extend towards and connect with the respective end portions 222. The torsion bars 22 of this embodiment can also be arranged in the same way as those in the second embodiment, but the present disclosure is not limited as such.

In summary of the above, in the bolster of the present disclosure, with the designs of the torsion bars and the restricting portions of the torsion bars and the corresponding side plates and the restricting openings of the side plates or fastening portions, the bolster of the present disclosure is free from requiring other restricting components and is capable of reducing design and manufacturing costs without compromising the overall strength. Moreover, forces can be distributed uniformly on the bottom plate to improve the fastening of the heat-dissipating device, and warpage and deformation of the bottom plate can be effectively reduced.

The above embodiments are set forth to illustrate the principles of the present disclosure, and should not be interpreted as to limit the present disclosure in any way. The above embodiments can be modified by one of ordinary skill in the art without departing from the scope of the present disclosure as defined in the appended claims.

What is claimed is:

1. A bolster, comprising:
   a bottom plate including a side plate extending upwards from a side of the bottom plate and a holding portion bending inwards from an edge of the side plate;
   a pillar vertically provided on the bottom plate and adjacent to the holding portion; and
   a torsion bar including a main body portion and two bent end portions at two ends of the main body portion, wherein the main body portion is restricted by the side plate, and one of the two bent end portions is fixed in the pillar and restricted by the holding portion;
   wherein a restricting opening is formed through the side plate, and the main body portion includes a bent restricting portion with a bending direction opposite to a bending direction of the two bent end portions, and wherein the bent restricting portion is inserted in the restricting opening and restricted by the restricting opening.

2. The bolster of claim 1, wherein the bottom plate is provided with a fastening hole adjacent to the side plate, such that the other one of the two bent end portions of the torsion bar is secured in the fastening hole.

3. The bolster of claim 1, wherein the bottom plate further includes another holding portion bending inwards from the edge of the side plate and provided separately from the holding portion to restrict the other one of the two bent end portions of the torsion bar.

4. The bolster of claim 3, wherein the restricting opening is arranged between the holding portion and the another holding portion.

5. The bolster of claim 3, further comprising a fastener provided on the bottom plate and adjacent to the restricting opening, wherein the fastener abuts against the bent restricting portion and keeps the bent restricting portion inside the restricting opening.

6. The bolster of claim 1, wherein the bent restricting portion is free from protruding from the side plate.

7. A bolster, comprising:
   a bottom plate including a side plate extending upwards from a side of the bottom plate and a holding portion bending inwards from an edge of the side plate;
   a pillar vertically provided on the bottom plate and adjacent to the holding portion;
   a torsion bar including a main body portion and two end portions at two ends of the main body portion, wherein the main body portion is restricted by the side plate, and one of the two end portions is fixed in the pillar and restricted by the holding portion; and
   an opening arranged at a center of the bottom plate, wherein the bottom plate further includes a fastening piece extending upwards from an edge of the bottom plate adjacent to the opening and bending to extend to the side plate, and wherein the fastening piece is fixed in a recess hollowed inwards from the edge of the side plate, such that the torsion bar is restricted by the fastening piece.

8. A bolster, comprising:
   a bottom plate including a side plate extending upwards from a side of the bottom plate and a holding portion bending inwards from an edge of the side plate;
   a pillar vertically provided on the bottom plate and adjacent to the holding portion;
   a torsion bar including a main body portion and two bent end portions at two ends of the main body portion, wherein the main body portion is restricted by the side plate, and one of the two bent end portions is fixed in the pillar and restricted by the holding portion; and
   an opening arranged at a center of the bottom plate, wherein the bottom plate includes a fastening portion extending upwards from an edge of the bottom plate adjacent to the opening, such that the main body portion is restricted by both the fastening portion and the side plate;
   wherein the main body portion includes a bent restricting portion with a bending direction opposite to a bending direction of the two bent end portions, and wherein the bent restricting portion abuts against the fastening portion and the main body portion abuts against the side plate, such that the main body portion is restricted between the fastening portion and the side plate through the bent restricting portion.

9. The bolster of claim 8, wherein the other one of the two bent end portions of the torsion bar is fixed in a fastening hole of the fastening portion.

10. A bolster, comprising:
    a bottom plate including a side plate extending upwards from a side of the bottom plate and a holding portion bending inwards from an edge of the side plate;
    a pillar vertically provided on the bottom plate and adjacent to the holding portion;
    a torsion bar including a main body portion and two end portions at two ends of the main body portion, wherein the main body portion is restricted by the side plate, and one of the two end portions is fixed in the pillar and restricted by the holding portion; and
    an opening arranged at a center of the bottom plate, wherein the bottom plate includes a fastening portion extending upwards from an edge of the bottom plate adjacent to the opening, and wherein an edge of the fastening portion further includes a fastening piece extending towards the side plate and secured in a recess hollowed inwards from the edge of the side plate.

* * * * *